(12) United States Patent
Zhu et al.

(10) Patent No.: US 9,419,112 B2
(45) Date of Patent: Aug. 16, 2016

(54) METHOD FOR MANUFACTURING FIN STRUCTURE

(71) Applicant: Institute of Microelectronics, Chinese Academy of Sciences, Beijing (CN)

(72) Inventors: Huilong Zhu, Poughkeepsie, NY (US); Jun Luo, Beijing (CN); Chunlong Li, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/647,360

(22) PCT Filed: Dec. 17, 2012

(86) PCT No.: PCT/CN2012/086743
§ 371 (c)(1),
(2) Date: May 26, 2015

(87) PCT Pub. No.: WO2014/082351
PCT Pub. Date: Jun. 5, 2014

(65) Prior Publication Data
US 2015/0303274 A1 Oct. 22, 2015

(30) Foreign Application Priority Data
Nov. 30, 2012 (CN) .......................... 2012 1 0505760

(51) Int. Cl.
*H01L 21/265* (2006.01)
*H01L 21/306* (2006.01)
*H01L 29/66* (2006.01)
(Continued)

(52) U.S. Cl.
CPC .......... *H01L 29/6681* (2013.01); *H01L 21/265* (2013.01); *H01L 21/30604* (2013.01); *H01L 21/31053* (2013.01); *H01L 21/32115* (2013.01); *H01L 29/1083* (2013.01); *H01L 29/16* (2013.01); *H01L 29/6656* (2013.01); *H01L 29/66795* (2013.01); *H01L 29/7851* (2013.01); *H01L 29/165* (2013.01); *H01L 29/7848* (2013.01)

(58) Field of Classification Search
None
See application file for complete search history.

(56) References Cited

U.S. PATENT DOCUMENTS

| 5,013,680 A | 5/1991 | Lowrey |
| 2008/0182419 A1 | 7/2008 | Yasui et al. |

(Continued)

FOREIGN PATENT DOCUMENTS

| CN | 102087970 A | 6/2011 |
| CN | 102117737 A | 7/2011 |

(Continued)

OTHER PUBLICATIONS

International Search Report (PCT/CN2012/086743).
(Continued)

*Primary Examiner* — Asok K Sarkar
(74) *Attorney, Agent, or Firm* — Steven McMahon Zeller; Dykema Gossett PLLC

(57) ABSTRACT

A method for manufacturing a fin structure is provided. A method according to an embodiment may include: forming a patterned pattern transfer layer on a substrate; forming a first spacer on sidewalls of the pattern transfer layer; forming a second spacer on sidewalls of the first spacer; selectively removing the pattern transfer layer and the first spacer; and patterning the substrate with the second spacer as a mask, so as to form an initial fin.

12 Claims, 15 Drawing Sheets

(51) Int. Cl.
*H01L 29/78* (2006.01)
*H01L 21/3105* (2006.01)
*H01L 21/321* (2006.01)
*H01L 29/10* (2006.01)
*H01L 29/16* (2006.01)
*H01L 29/165* (2006.01)

(56) References Cited

U.S. PATENT DOCUMENTS

2013/0084688 A1* 4/2013 O'Meara ............. H01L 21/0338 438/478
2013/0230965 A1* 9/2013 Sudo ................... H01L 21/0337 438/404

FOREIGN PATENT DOCUMENTS

CN 102148199 A 8/2011
CN 102768957 A 11/2012

OTHER PUBLICATIONS

English Translation of Written Opinion of International Searching Authority (PCT/CN2012/086743).

First Office Action, Dec. 31, 2015 for Chinese Patent Application 201210505760.9.

English Translation of First Office Action, Dec. 31, 2015 for Chinese Patent Application 201210505760.9.

* cited by examiner (a)

(b)

METHOD FOR MANUFACTURING FIN STRUCTURE

CROSS-REFERENCE TO RELATED APPLICATION(S)

This application is a U.S. national phase application of PCT Application No. PCT/CN2012/086743, file on Dec. 17, 2012, entitled "METHOD FOR MANUFACTURING FIN STRUCTURE," which claimed priority to Chinese Application No. 201210505760.9, filed on Nov. 30, 2012. Both the PCT Application and the Chinese Application are incorporated by reference in their entireties.

TECHNICAL FIELD

The present disclosure relates to the semiconductor field, and in particular, to a method for manufacturing a fin structure.

BACKGROUND

As planar semiconductor devices are scaling down, short channel effects become more significant. Therefore, three-dimensional (3D) semiconductor devices, such as, FinFETs (Fin Field Effect Transistors) are proposed. In general, a FinFET includes a fin formed vertically on a substrate and a gate stack intersecting with the fin. Therefore, conductive channels may be formed on sidewalls of the fin.

In general, a fin may be acquired by patterning a substrate or a semiconductor layer further formed on a substrate. However, due to limitations of the patterning process, such as, lithography, Reactive Ion Etching (RIE), or the like, the acquired fin usually has a relatively large Line Edge Roughness (LER).

SUMMARY

The present disclosure aims to provide, among others, a method for manufacturing a fin.

According to an aspect of the present disclosure, there is provided a method for manufacturing a fin structure, comprising: forming a patterned pattern transfer layer on a substrate; forming a first spacer on sidewalls of the pattern transfer layer; forming a second spacer on sidewalls of the first spacer; selectively removing the pattern transfer layer and the first spacer; and patterning the substrate with the second spacer as a mask, so as to form an initial fin.

BRIEF DESCRIPTION OF THE DRAWINGS

The above and other objects, features, and advantages of the present disclosure will become more apparent from following descriptions on embodiments thereof with reference to attached drawings, in which.

DETAILED DESCRIPTION

Figure 1:
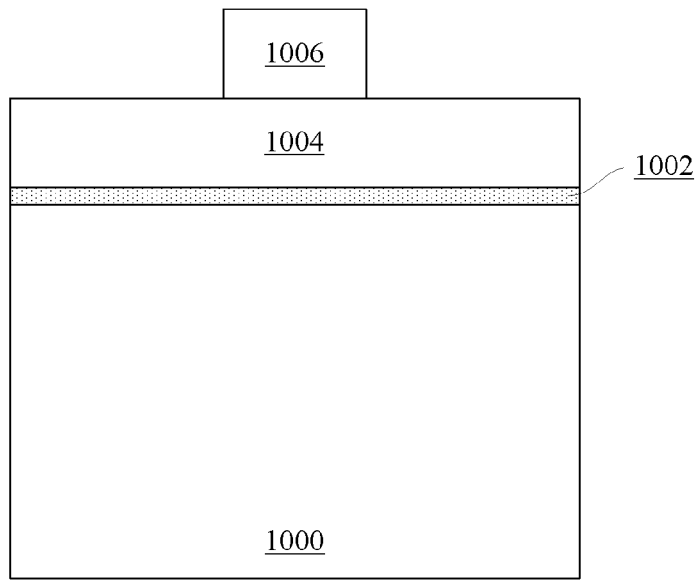
FIGS. 1-19 are schematic views illustrating a process for manufacturing a fin structure according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

Typically, in order to pattern a substrate or a material layer on a substrate, a mask layer (for example, photoresist) may be formed on the substrate or the material layer, and then patterned into a desired pattern (for example, the photoresist can be patterned by exposure and development). The substrate or the material layer can be patterned (for example, by RIE) with the patterned mask layer as a mask. In this process, there are a number of factors resulting in the LER, such as, the patterning of the mask layer (or in other words, lithography), RIE, or the like.

Instead of the above conventional process, according to an embodiment of the present disclosure, a patterned pattern transfer layer may be formed on the substrate or the material layer. This pattern transfer layer may also suffer from the LER due to the patterning process. On sidewalls of this pattern transfer layer, a first spacer may be formed by a spacer forming process. Sidewalls of such a spacer formed by the spacer forming process will typically have a smaller LER than that of sidewalls of a feature (for example, sidewalls of the pattern transfer layer) obtained by direct patterning (for example, RIE) with aid of a mask layer. Therefore, although the sidewalls of the first spacer thus obtained in contact with the pattern transfer layer have an LER corresponding to that of the sidewalls of the pattern transfer layer, the sidewalls of the first spacer opposite to the pattern transfer layer have a relatively small LER.

Next, a second spacer may be further formed on the outer sidewalls of the first spacer (i.e., the sidewalls with the relatively small LER). Sidewalls of the second spacer in contact with the first spacer have an LER corresponding to the LER of the outer sidewalls of the first spacer, which is therefore relatively small. On the other hand, sidewalls of the second spacer opposite to the first spacer are formed by a spacer forming process as described above, and therefore have a relatively small LER. As a result, the sidewalls on both sides of the second spacer each have a relatively small LER.

Subsequently, the pattern transfer layer and the first spacer may be selectively removed. In this way, the second spacer whose sidewalls have the relatively small LER is left on the substrate or the material layer. The substrate or the material layer can be patterned with the second spacer as a mask to obtain a feature (for example, a fin) with a relatively small LER.

Here, in order to selectively remove the pattern transfer layer and the first spacer, the second spacer may comprise a material different from those for the pattern transfer layer and the first spacer (the pattern transfer layer and the first spacer may comprise the same material or different materials). The material for each of the pattern transfer layer, the first spacer, and the second spacer may be selected from a group consisting of amorphous silicon, polycrystalline silicon, oxide, and nitride.

The technology of the present disclosure can be implemented in various ways, some of which are illustrated in the following by way of example.

As shown in FIG. 1, a substrate 1000 is provided. The substrate 1000 may comprise various forms of substrates, for example, but not limited to a bulk semiconductor substrate, such as, a bulk Si substrate, a Semiconductor on Insulator (SOI) substrate, a SiGe substrate, or the like. In the following descriptions, the bulk Si substrate is described by way of example.

On the substrate 1000, a stop layer 1002 may be formed by, for example, deposition. The stop layer 1002 may comprise, for example, oxide (such as silicon oxide), with a thickness of about 10-50 nm. On the stop layer 1002, a pattern transfer layer 1004 may be formed by, for example, deposition. The pattern transfer layer 1004 may comprise, for example, amorphous silicon, with a thickness of about 100-200 nm.

Figure 2:
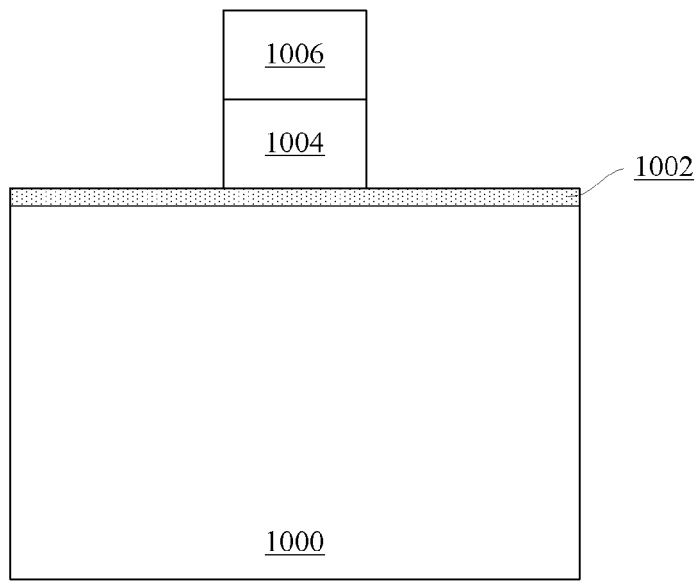
Figure 2A:
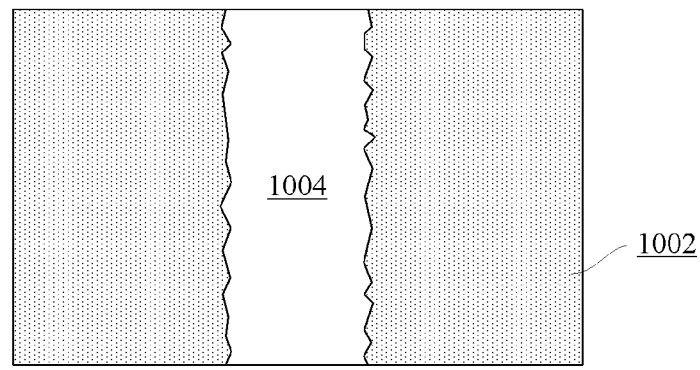

The pattern transfer layer may be patterned according to a design. In particular, as shown in FIG. 1, a patterned mask layer 1006 (for example, photoresist which has been exposed and developed) may be formed on the pattern transfer layer 1004. Next, as shown in FIG. 2, the pattern transfer layer 1004 may be patterned by, for example, RIE, with the mask layer 1006 as a mask. Such patterning may be stopped at the stop layer 1002. After the patterning, the mask layer 1006 may be removed. Referring to FIG. 2a, sidewalls of the patterned pattern transfer layer 1004 may have a relatively large LER.

Figure 3:
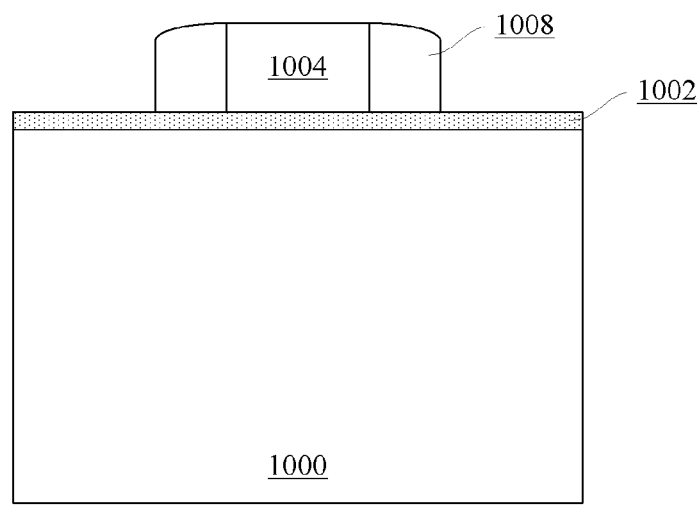

After that, as shown in FIG. 3, a first spacer 1008 may be formed on the sidewalls of the pattern transfer layer 1004 by a spacer forming process. There are various spacer forming processes. According to an embodiment, the first spacer 1008 may be formed as follows. In particular, a spacer material layer (for example, amorphous silicon) may be formed by, for example, deposition on the substrate (in this example, on the stop layer 1002). The spacer material layer may have a thickness of about 10-60 nm. Subsequently, RIE may be performed on the spacer material layer such that the spacer material layer is left only on the sidewalls of the pattern transfer layer 1004 so as to form the first spacer 1008.

Figure 3A:
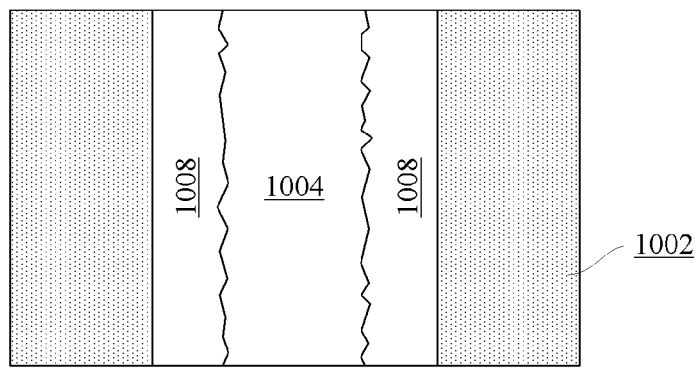

Referring to FIG. 3a, sidewalls of the first spacer 1008 in contact with the pattern transfer layer 1004 correspond to the sidewalls of the pattern transfer layer 1004, and therefore may have a relatively large LER. On the other hand, sidewalls of the first spacer 1008 opposite to the pattern transfer layer 1004 may have a relatively small LER. This is partially because the spacer forming process can be done without a mask.

Figure 4:
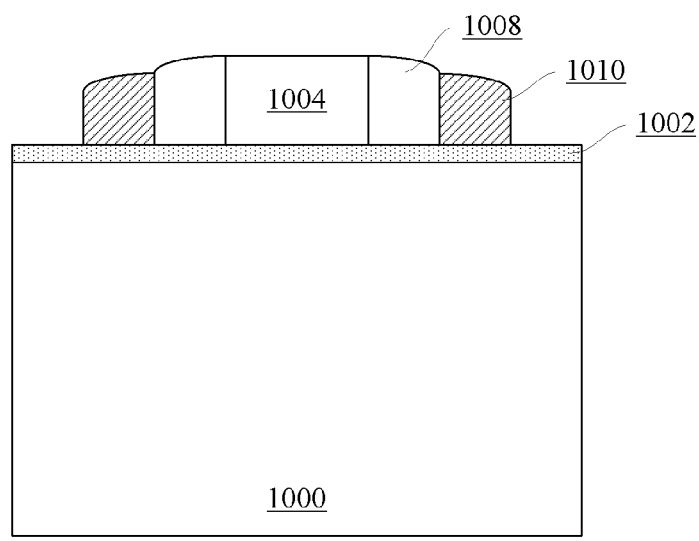

Next, as shown in FIG. 4, a second spacer 1010 may be further formed on the sidewalls of the first spacer 1008. There are various spacer forming processes. According to an embodiment, the second spacer 1010 may be formed as follows. In particular, another spacer material layer (for example, nitride, such as, silicon nitride) may be formed by, for example, deposition on the substrate (in this example, on the stop layer 1002). The other spacer material layer may have a thickness of about 5-30 nm. Subsequently, RIE may be performed on the other spacer material layer with respect to the stop layer 1002 (for example, oxide) and also the pattern transfer layer 1004 and the first spacer 1008 (for example, amorphous silicon) such that the other spacer material layer is left only on the sidewalls of the first spacer 1008 so as to form the second spacer 1010.

Figure 4A:
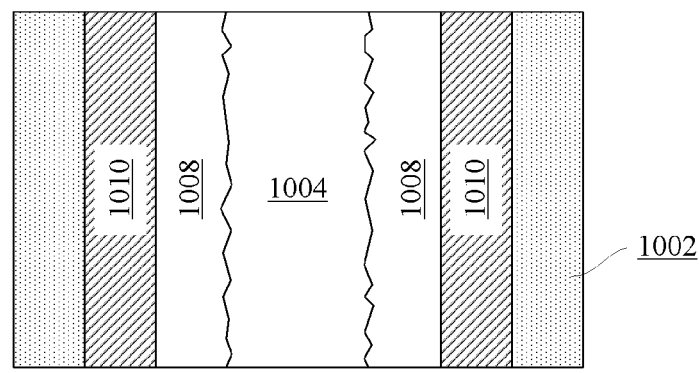

Referring to FIG. 4a, sidewalls of the second spacer 1010 in contact with the first spacer 1008 correspond to the sidewalls of the first spacer 1008, and therefore may have a relatively small LER. On the other hand, sidewalls of the second spacer 1010 opposite to the first spacer 1008 may also have a relatively small LER. This is partially because the spacer forming process can be done without a mask.

Figure 5:
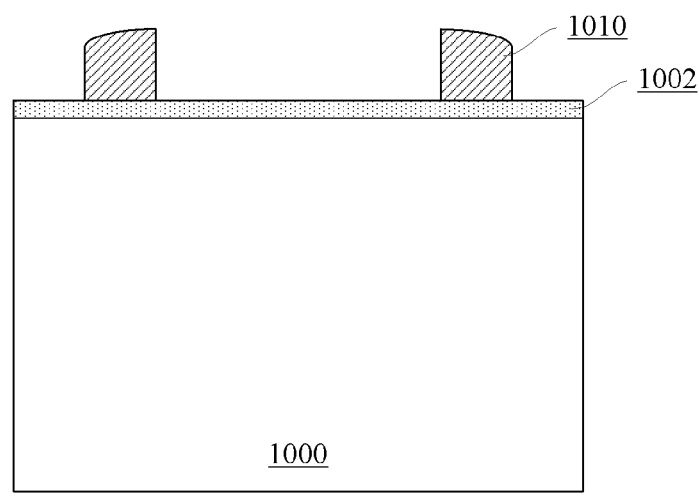
Figure 5A:
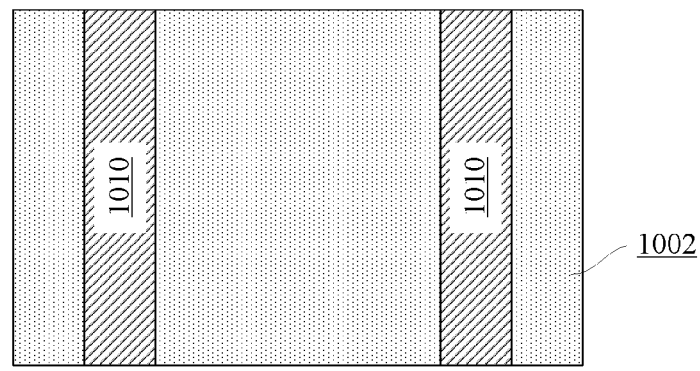

Next, as shown in FIG. 5, the pattern transfer layer 1004 and the first spacer 1008 (for example, amorphous silicon) may be selectively removed with respect to the second spacer 1010 (for example, nitride) and the stop layer 1002 (for example, oxide). For example, the pattern transfer layer 1004 and the first spacer 1008 may be wet-etched by TMAH. In this way, the second spacer 1010 is left, and the sidewalls thereof on opposite sides have the relatively small LER, as shown in FIG. 5a.

In the above examples, the pattern transfer layer 1004 and the first spacer 1008 comprise amorphous silicon, and the second spacer 1010 comprises nitride. However, the present disclosure is not limited thereto. For example, the pattern transfer layer 1004 and the first spacer 1008 may comprise nitride and the second spacer 1010 may comprise amorphous silicon. It suffices that the pattern transfer layer 1004 and the first spacer 1008 can be selectively removed with respect to the second spacer 1010 (and the substrate).

Further, the pattern transfer layer 1004 and the first spacer 1008 may comprise different materials. For example, the pattern transfer layer 1004 may comprise amorphous silicon, and the first spacer 1008 may comprise polycrystalline silicon (in this case, the second spacer 1010 may comprise nitride).

Further, in a case where there is sufficient etching selectivity between the pattern transfer layer 1004 and the substrate 1000, the stop layer 1002 may be omitted. For example, in an example where the substrate 1000 comprises Si, the pattern transfer layer 1004 (and the first spacer 1008) may comprise SiGe, and the second spacer 1010 may comprise nitride.

Figure 6:
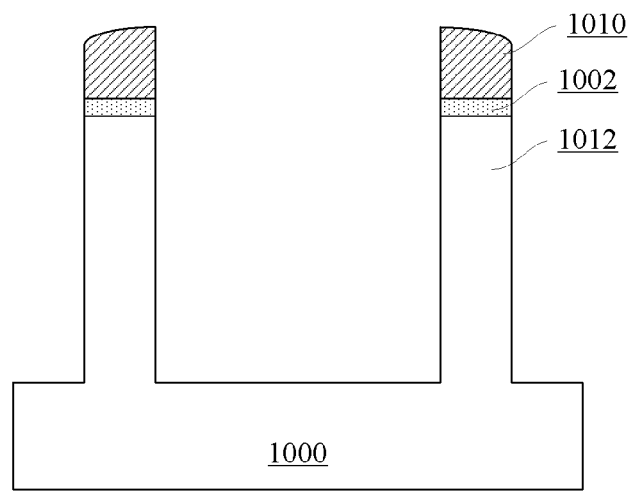

Next, as shown in FIG. 6, the substrate 1000 may be patterned (for example, by RIE) with the second spacer 1010, whose sidewalls have the relatively small LER, as a mask, to form initial fins 1012. After that, the second spacer 1010 may be removed. Because the LER for the sidewalls of the second spacers 1010 is relatively small, sidewalls of the initial fins 1012 thus formed also have a relatively small LER.

In the embodiment shown in FIG. 6, two initial fins 1012 are formed with aid of the second spacer 1010. However, the present disclosure is not limited thereto. For example, another second spacer may be formed and other initial fins 1012 are thus formed.

Further, the initial fin is not limited to being formed by directly patterning the substrate. For example, the initial fin may be formed by epitaxially growing another semiconductor layer on the substrate and then patterning the other semiconductor layer. If there is sufficient etching selectivity between the other semiconductor layer and the substrate, the patterning of the initial fin may be stopped at the substrate, so as to implement a more precise control on a height of the initial fin.

Therefore, in the present disclosure, the expression "patterning a substrate to form an initial fin" may cover any appropriate manner in which the substrate itself or a material layer on the substrate is patterned to form the initial fin. In the latter case, the material layer may be considered as a part of the substrate.

After the initial fins are formed by the above process, an isolation layer may be formed on the substrate.

Figure 7:
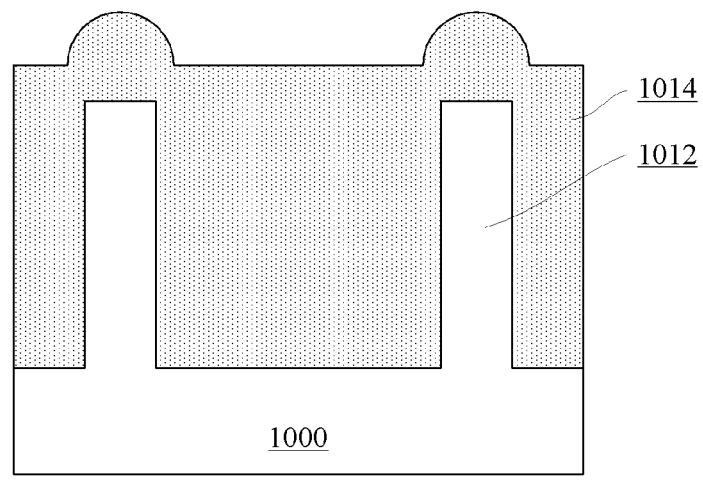

In particular, as shown in FIG. 7, a dielectric layer 1014 may be formed by, for example, deposition on the substrate to cover the formed initial fins 1012. For example, the dielectric layer 1014 may comprise oxide. In this embodiment, because the dielectric layer 1014 and the stop layer 1002 comprise the same material (oxide), the stop layer 1002 will not be displayed separately in the subsequent figures.

After that, the dielectric layer 1014 may be etched back with respect to the initial fins 1012 (for example, Si) to expose a portion of the respective initial fins 1012. The exposed portion of the initial fin 1012 may be subsequently used as a fin for a finished device. The etched-back dielectric layer 1014 constitutes the isolation layer.

Figure 8:
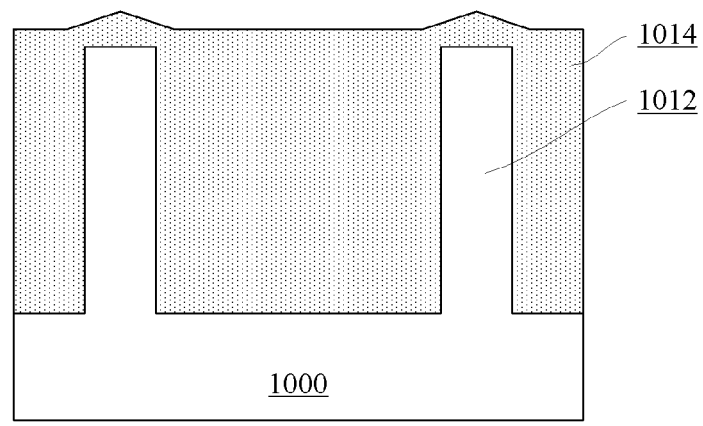

In order to make a top surface of the isolation layer relatively flat, a planarization process, such as, Chemical Mechanical Polishing (CMP), may be performed on the dielectric layer 1014 before the dielectric layer 1014 is etched back. However, it is difficult for the CMP to control the flatness of the surface within several nanometers. Therefore, according to an embodiment of the present disclosure, in order to improve the surface flatness of the isolation layer, as shown in FIG. 8, the dielectric layer 1014 may be planarized by sputtering. For example, plasmas, such as, Ar or N plasma, may be used for the sputtering. Here, sputtering parameters, such as sputtering power and atmospheric pressure, may be controlled according to a cutting rate of the plasma sputtering on the dielectric layer 1014, so as to determine a time period for the plasma sputtering. Thus, the plasma sputtering can be performed for a certain time period so as to sufficiently smooth the surface of the dielectric layer 1014. Although FIG. 8 shows microscopic fluctuations, the top surface of the dielectric layer 1014 actually has a sufficient flatness, with fluctuations thereof controlled within several nanometers.

On the other hand, in the embodiment shown in FIG. 8, the plasma sputtering may be stopped before reaching the top surface of the initial fins 1012, to avoid excessive damages to the initial fins 1012. According to another embodiment of the present disclosure, CMP may be performed at a little dose as required on the dielectric layer 1014 after being planarized by sputtering.

Figure 9:
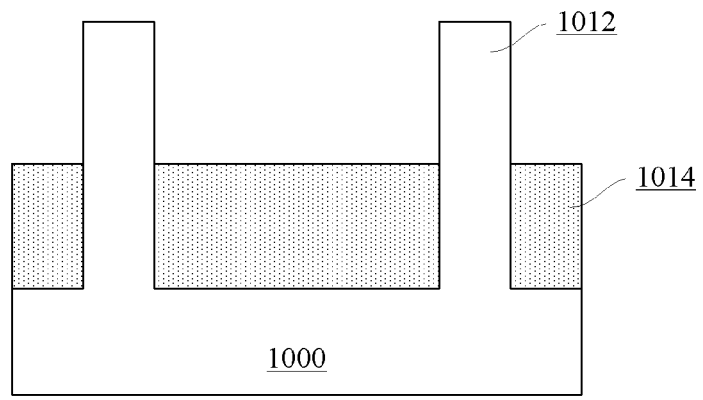

Next, as shown in FIG. 9, the planarized dielectric layer 1014 may be etched back (for example, by RIE) to obtain the isolation layer 1014. Because the surface of the dielectric layer 1014 before the etching-back is planarized by sputtering, the surface of the isolation layer 1014 after the etching-back is kept substantially consistent across the substrate.

Figure 10:
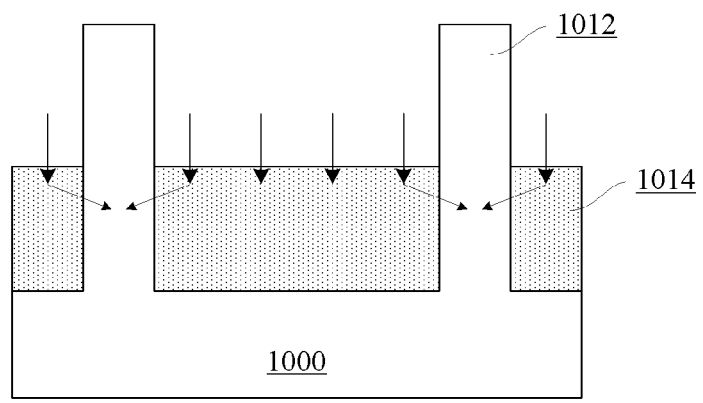

According to an embodiment of the present disclosure, a punch-through stopper (referring to 1016 shown in FIG. 11) may be formed by implantation to improve device performances, as shown by the arrows in FIG. 10. For example, with regard to an N-type device, P-type impurities, such as, B, $BF_2$, or In, may be implanted; with regard to a P-type device, N-type impurities, such as, As or P, may be implanted. The ion implantation may be performed in a direction substantially perpendicular to the substrate surface. Parameters for the ion implantation may be controlled, so that the punch-through stopper may be formed in a portion of the initial fin which is located below the surface of the isolation layer 1014 and may have a desired doping concentration. It should be noted that a part of dopants (ions or elements) may be scattered from the exposed portion of the initial fin due to a form factor of the initial fin. Thus, it is beneficial to form an abrupt doping distribution in a depth direction. Annealing may be performed to activate the implanted impurities. Such a punch-through stopper may facilitate to reduce leakage between source and drain.

Figure 11:
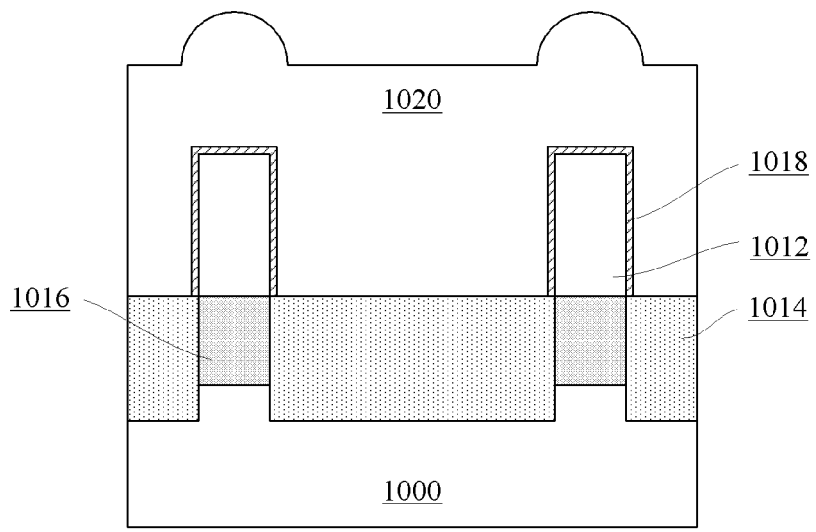

After that, a gate stack across the fin may be formed on the isolation layer 1014. For example, this can be done as follows. In particular, as shown in FIG. 11, a gate dielectric layer 1018 may be formed by, for example, deposition. For example, the gate dielectric layer 1018 may comprise oxide with a thickness of about 0.8-1.5 nm. In the embodiment shown in FIG. 11, the gate dielectric layer 1018 is shown in a shape of "⊓". However, the gate dielectric layer 1018 may comprise parts extending on the surface of the isolation layer 1014.

Subsequently, a gate conductor layer 1020 may be formed by, for example, deposition. The gate conductor layer 1020 may comprise polycrystalline silicon. The gate conductor layer 1020 may have a thickness of about 30-200 nm to fill gaps between the fins. The gate conductor layer 1020 may be planarized. Again, this planarization may also be performed by sputtering, as shown in FIG. 12.

Figure 13:
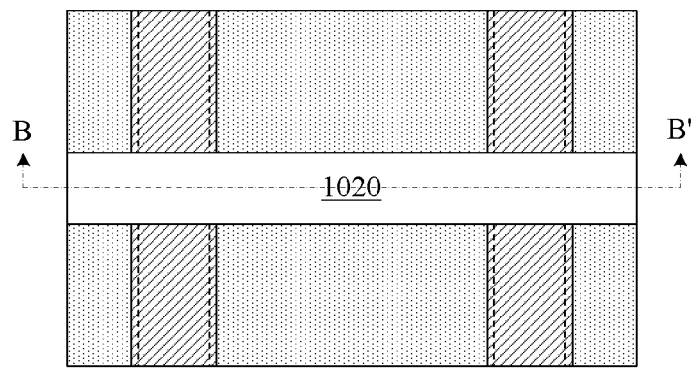
Figure 13:
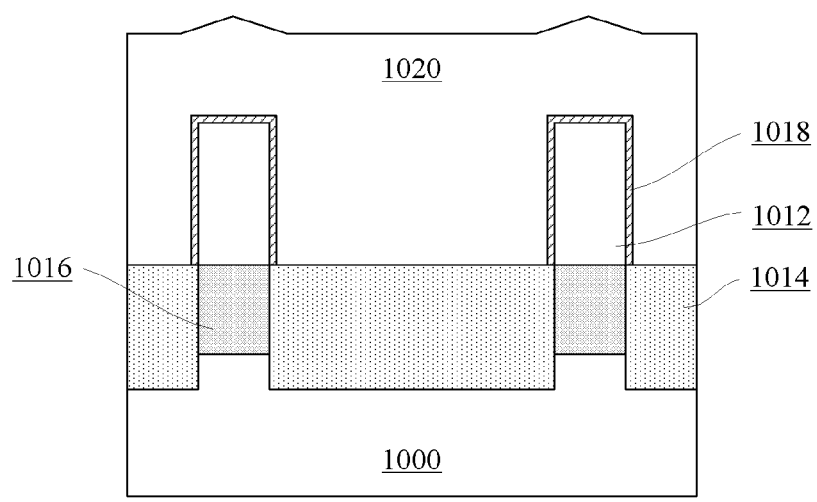

Next, as shown in FIG. 13 (FIG. 13(b) shows a cross-sectional view along line BB' in FIG. 13(a)), the gate conductor layer 1020 is patterned to form a gate stack. In the embodiment of FIG. 13, the gate conductor layer 1020 is patterned into a strip intersecting the fins. According to another embodiment, the gate dielectric layer 1018 may be further patterned with the patterned gate conductor layer 1020 as a mask.

Figure 12:
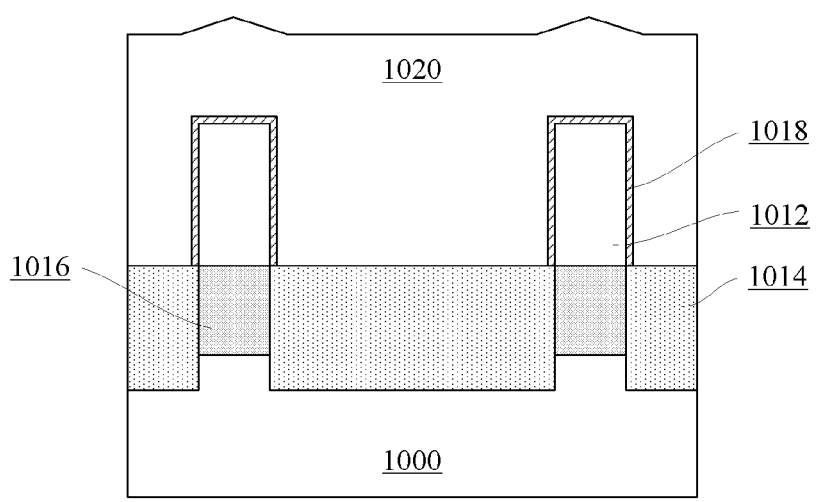

In FIG. 12 and FIG. 13(b), microscopic fluctuations on the planarized gate conductor layer 1020 are shown. In fact, such fluctuations are pretty small, for example, within several nanometers. In subsequent figures, such microscopic fluctuations will not be shown any more for simplicity.

After the gate conductor is patterned, halo implantation and extension implantation may be performed, with the gate conductor as a mask, for example.

Figure 14:
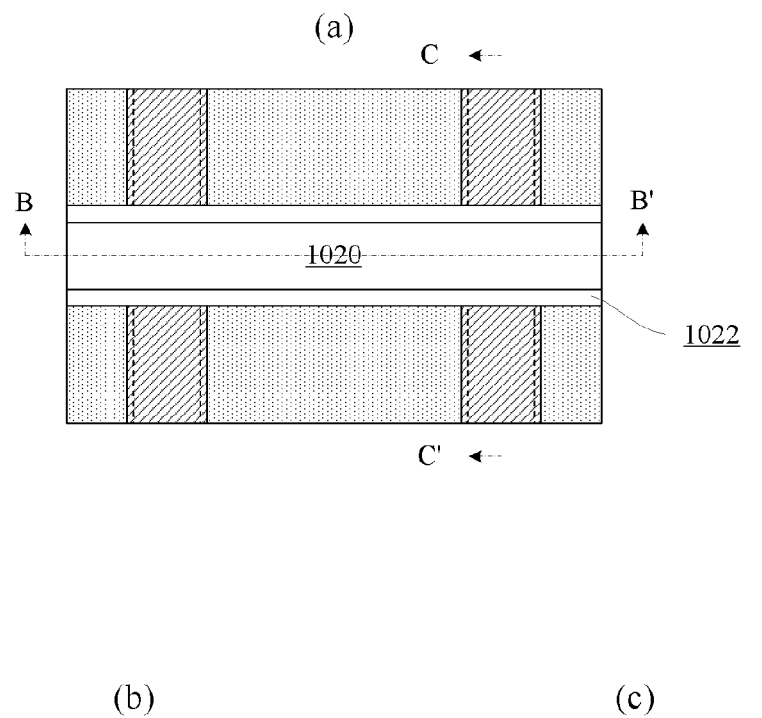

After that, as shown in FIG. 14 (FIG. 14(b) shows a cross-sectional view along line BB' in FIG. 14(a), and FIG. 14(c) shows a cross-sectional view along line CC' in FIG. 14(a)), a spacer 1022 may be formed on sidewalls of the gate conductor layer 1020. For example, a nitride layer with a thickness of about 5-20 nm may be formed by, for example, deposition, and then subjected to RIE to form the spacer 1022. There are various ways to form the spacer, and detailed descriptions thereof are omitted here. When the trenches between the fins are tapered from top down (which is a common situation due to characteristics of etching), the spacer 1022 may have substantially no portion formed on sidewalls of the fins.

After the spacer is formed, source/drain (S/D) implantation may be performed with the gate conductor and the spacer as a mask. Subsequently, annealing may be performed to activate the implanted ions, so as to form source/drain regions, resulting in FinFETs.

In the embodiment as illustrated above, the gate stack is directly formed after the fins are formed. However, the present disclosure is not limited to this. For example, the present disclosure is also applicable to the gate last process. Further, the strained source/drain technique may also be incorporated.

According to another embodiment of the present disclosure, the gate dielectric layer 1018 and the gate conductor layer 1020 formed in FIG. 11 may be a sacrificial gate dielectric layer and a sacrificial gate conductor layer, respectively. Subsequently, the process may be continued in the way as described in connection with FIGS. 12-14.

Figure 15:
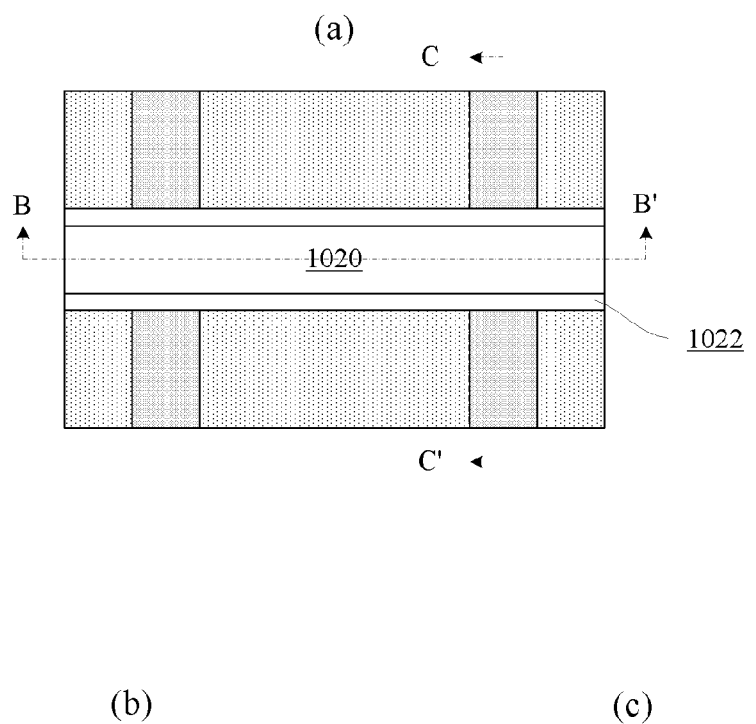

After that, as shown in FIG. 15 (FIG. 15(b) shows a cross-sectional view along line BB' in FIG. 15(a), and FIG. 15(c) shows a cross-sectional view along line CC' in FIG. 15(a)), exposed portions of the sacrificial gate dielectric layer 1018 may be selectively removed (for example, by RIE). In a case where both the sacrificial gate dielectric layer 1018 and the isolation layer 1014 comprise oxide, the RIE of the sacrificial gate dielectric layer 1018 may have substantially no impact on the isolation layer 1014 because the sacrificial gate dielectric layer 1018 is relatively thin. This operation is not required any more if the sacrificial gate dielectric layer has been further patterned with the sacrificial gate conductor as a mask in the process of forming the sacrificial gate stack as described above.

Next, portions of the initial fins 1012 which are exposed due to removal of the sacrificial dielectric layer 1018 may be selectively removed (for example, by RIE). The etching of those portions of the initial fins 1012 may be carried out until the punch-through stopper 1016 is exposed. Due to the presence of the sacrificial gate stack (the sacrificial gate dielectric layer, the sacrificial gate conductor and the spacer), a portion of the initial fin 1012 may be left under the sacrificial gate stack.

Figure 16:
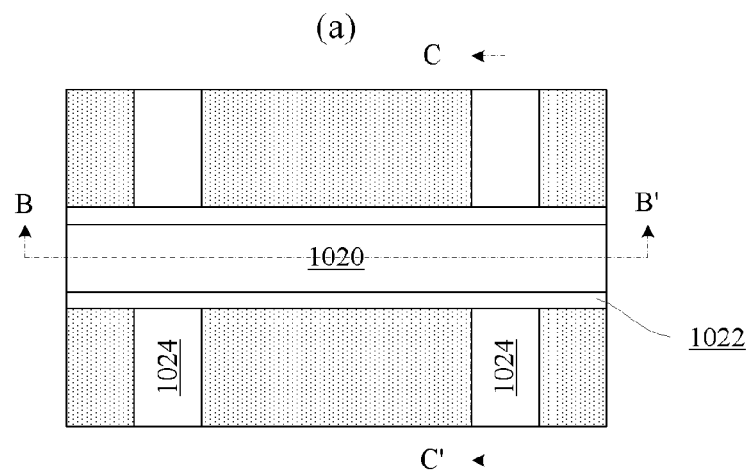
Figure 16:
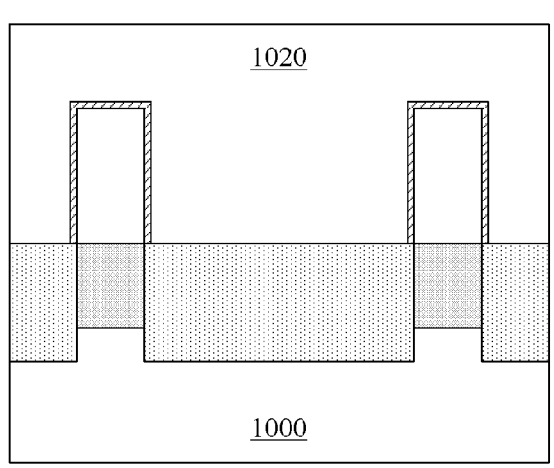
Figure 16:
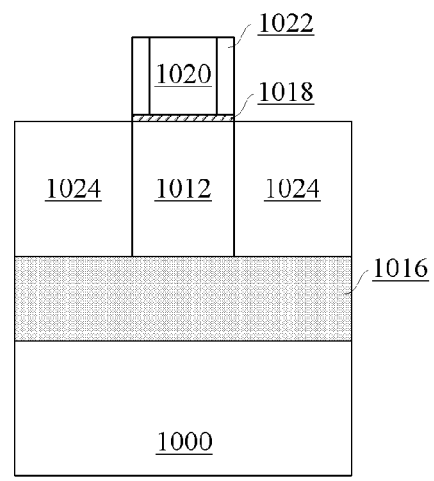

Subsequently, as shown in FIG. 16 (FIG. 16(*b*) shows a cross-sectional view along line BB' of FIG. 16(*a*), and FIG. 16(*c*) shows a cross-sectional view along line CC' of FIG. 16(*a*)), a semiconductor layer 1024 may be formed on exposed portions of the initial fin by, for example, epitaxy. Then, source/drain regions may be formed in the semiconductor layer 1024.

According to an embodiment of the present disclosure, the semiconductor layer 1024 may be doped in-situ while being grown. For example, N-type in-situ doping may be performed for an N-type device; while P-type in-situ doping may be performed for a P-type device. Moreover, in order to further improve the performances, the semiconductor layer 1024 may comprise a material different from that of the fin 1012 to apply stress to the fin 1002 (in which a channel of the device will be formed). For example, in a case where the fin 1012 comprises Si, the semiconductor layer 1024 may comprise Si:C (where an atomic percentage of C is e.g. about 0.2-2%) to apply tensile stress for the N-type device, or SiGe (where an atomic percentage of Ge is e.g. about 15-75%) to apply compressive stress for the P-type device.

In a case where the sacrificial gate conductor layer 1020 comprises polycrystalline silicon, the growth of the semiconductor layer 1024 may also occur on the top surface of the sacrificial gate conductor layer 1020. This is not shown in the figures.

Figure 17:
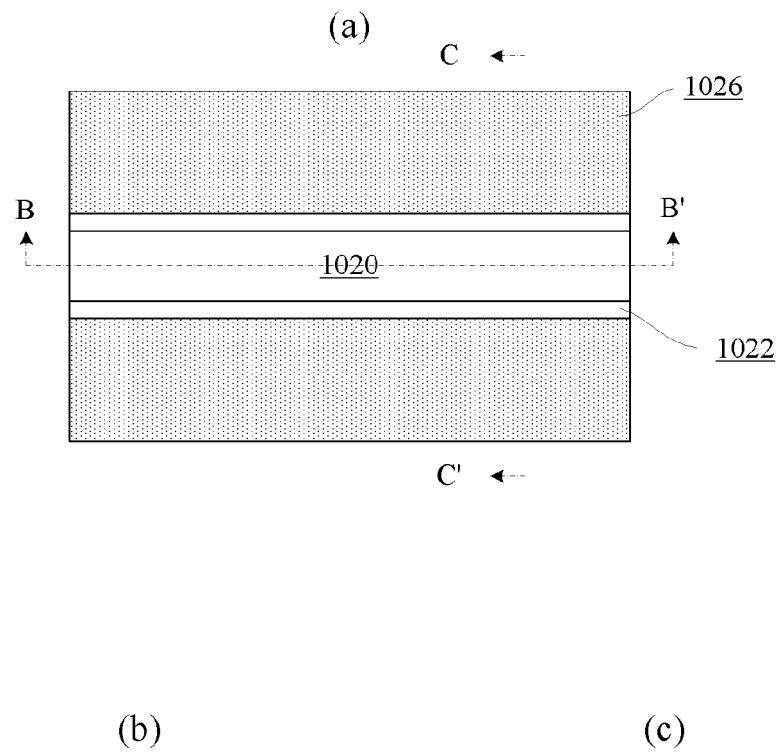

Next, as shown in FIG. 17 (FIG. 17(*b*) shows a cross-sectional view along line BB' of FIG. 17(*a*), and FIG. 17(*c*) shows a cross-sectional view along line CC' of FIG. 17(*a*)), another dielectric layer 1026 is formed by, for example, deposition. This dielectric layer 1026 may comprise oxide, for example. Subsequently, a planarization process, for example, CMP, may be performed on the dielectric layer 1026. The CMP may be stopped at the spacer 1022 to expose the sacrificial gate conductor 1020.

Figure 18:
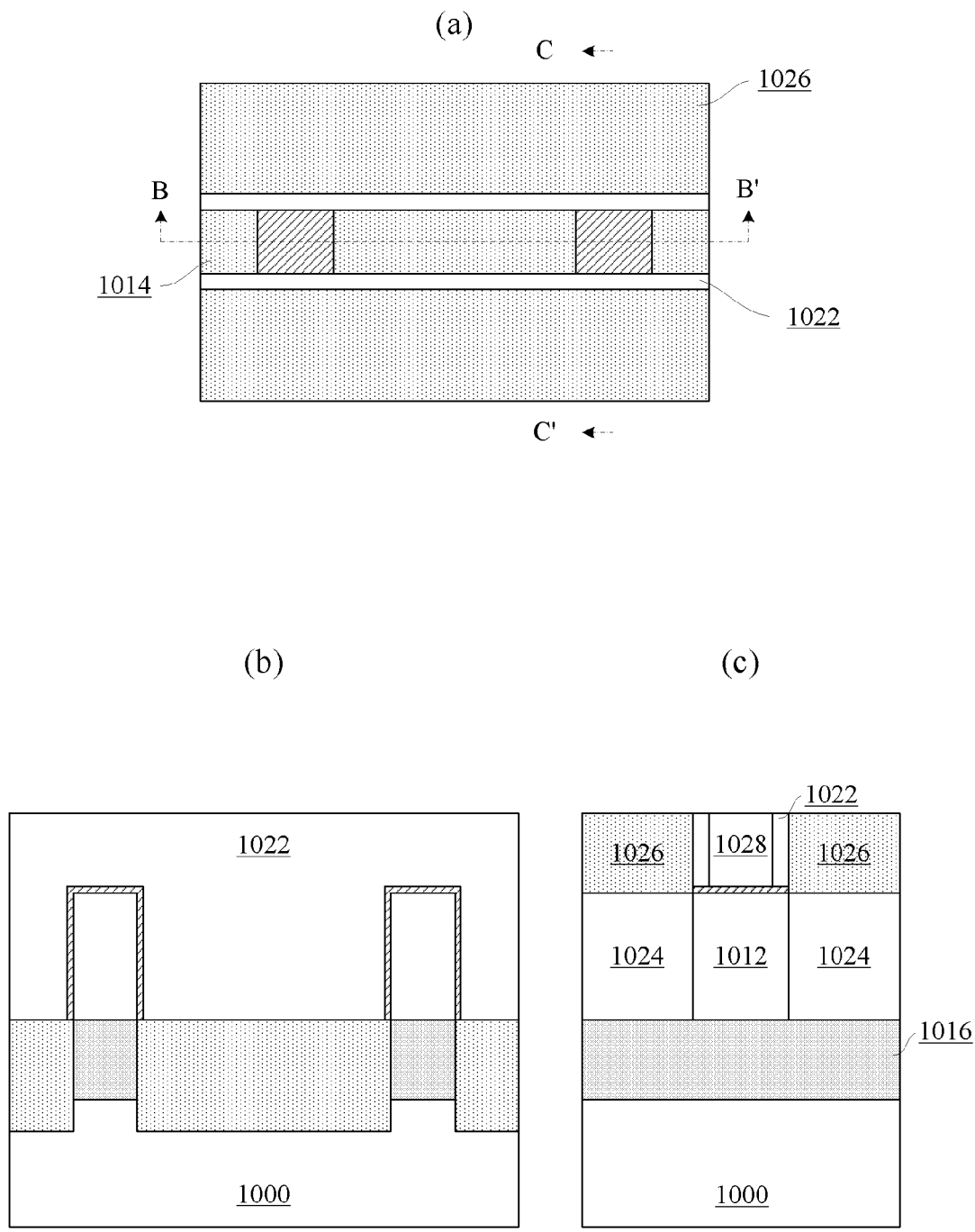

After that, as shown in FIG. 18 (FIG. 18(*b*) shows a cross-sectional view along line BB' of FIG. 18(*a*), and FIG. 18(*c*) shows a cross-sectional view along line CC' of FIG. 18(*a*)), the sacrificial gate conductor 1020 may be selectively removed by, for example, TMAH solution, to form a gap 1028 inside the spacer 1022. According to another embodiment, the sacrificial gate dielectric layer 1018 may be further removed.

Figure 19:
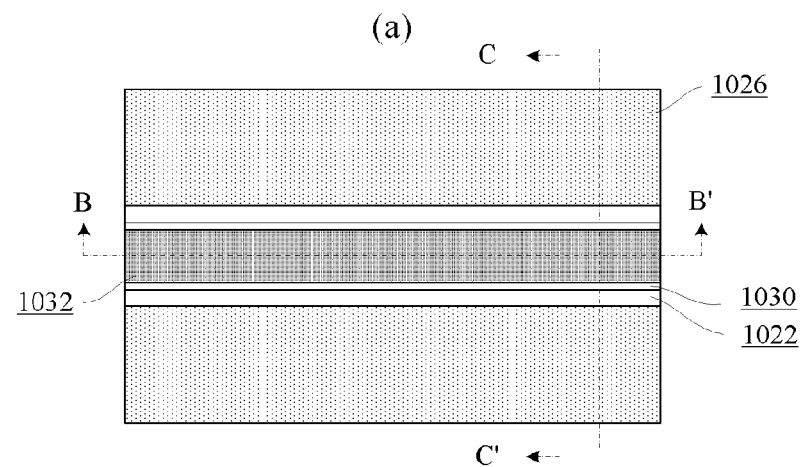
Figure 19:
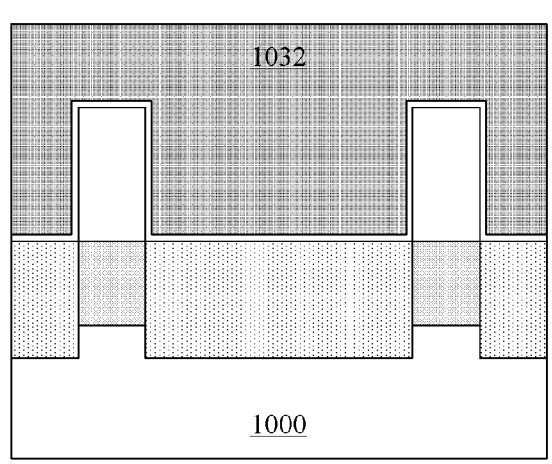
Figure 19:
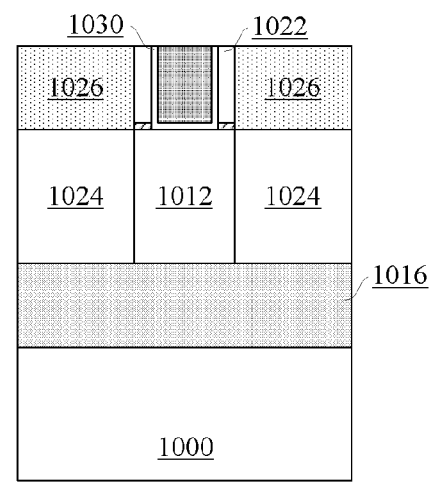

Subsequently, as shown in FIG. 19 (FIG. 19(*b*) shows a cross-sectional view along line BB' of FIG. 19(*a*), and FIG. 19(*c*) shows a cross-sectional view along line CC' of FIG. 19(*a*)), a final gate stack is formed by forming a gate dielectric layer 1030 and a gate conductor layer 1032 in the gap 1028. The gate dielectric layer 1030 may comprise a high-K gate dielectric, such as $HfO_2$, with a thickness of about 1-5 nm. The gate conductor layer 1032 may comprise a metal gate conductor. Preferably, a work function tuning layer (not shown) may be further formed between the gate dielectric layer 1030 and the gate conductor layer 1032.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method for manufacturing a fin structure, comprising:
    forming a patterned pattern transfer layer on a substrate;
    forming a first spacer on sidewalls of the pattern transfer layer with the same material as the pattern transfer layer;
    forming a second spacer on sidewalls of the first spacer;
    selectively removing the pattern transfer layer and the first spacer at the same time; and
    patterning the substrate with the second spacer as a mask, so as to form an initial fin with a reduced Line Edge Roughness (LER).

2. The method of claim 1, wherein the substrate comprises Si, the pattern transfer layer and the first spacer each comprise amorphous silicon, and the method further comprises: forming a stop layer on the substrate, on which the pattern transfer layer is formed.

3. The method of claim 2, wherein the second spacer comprises nitride, and the stop layer comprises oxide.

4. The method of claim 1, wherein the second spacer comprises a material different from that for the pattern transfer layer and the first spacer.

5. The method of claim 1, wherein each of the pattern transfer layer, the first spacer, and the second spacer comprises one selected from amorphous silicon, polycrystalline silicon, oxide, and nitride.

6. The method of claim 1, wherein after the initial fin is formed, the method further comprises:
    forming a dielectric layer on the substrate to cover the initial fin;
    planarizing the dielectric layer by sputtering; and
    further etching back the dielectric layer to expose a portion of the initial fin, the exposed portion serving as a fin.

7. The method of claim 6, wherein after the further etching-back, the method further comprises: performing ion implantation to form a punch-through stopper in a portion of the initial fin which is located below a surface of the further etched-back dielectric layer.

8. The method of claim 7, wherein after the ion implantation, the method further comprises:
    forming a sacrificial gate stack across the fin on the dielectric layer;
    selectively etching the initial fin with the sacrificial gate stack as a mask, until the punch-through stopper is exposed;

forming a semiconductor layer on exposed portions of the initial fin to form source/drain regions; and replacing the sacrificial gate stack with a gate stack.

9. The method of claim 8, wherein forming the sacrificial gate stack comprises:

forming a sacrificial gate dielectric layer;

forming a sacrificial gate conductor layer on the sacrificial gate dielectric layer to cover the fin;

planarizing the sacrificial gate conductor layer by sputtering; and patterning the gate conductor layer to form the sacrificial gate stack.

10. The method of claim 8, wherein the semiconductor layer is compressive stressed for a P-type device, and the semiconductor layer is tensile stressed for an N-type device.

11. The method of claim 10, wherein the substrate comprises Si, the initial fin is formed by patterning the substrate, and the semiconductor layer comprises SiGe or Si:C.

12. The method of claim 8, wherein the semiconductor layer is in-situ doped while being formed.

* * * * *